United States Patent [19]

Yang et al.

[11] Patent Number: 4,728,821
[45] Date of Patent: Mar. 1, 1988

[54] SOURCE FOLLOWER CURRENT MODE LOGIC CELLS

[75] Inventors: J. Leon Yang, Palo Alto, Calif.; Joseph P. Zeh, Bolton, Mass.

[73] Assignee: Digital Equipment Corporation, Maynard, Mass.

[21] Appl. No.: 725,255

[22] Filed: Apr. 19, 1985

[51] Int. Cl.[4] .................. H03K 19/017; H03K 19/086; G06F 7/50; G06G 7/12

[52] U.S. Cl. ..................... 307/448; 307/455; 307/471; 307/497; 307/559

[58] Field of Search ............... 307/448, 455, 495, 497, 307/453, 471, 279, 559, 551, 565, 563, 264, 450

[56] References Cited

U.S. PATENT DOCUMENTS 4,393,315 7/1983 Stickel et al.
4,412,336 10/1983 Peltier et al. .......................... 307/279

FOREIGN PATENT DOCUMENTS 0148465 11/1979 Japan .................................... 307/264
2081041 2/1982 United Kingdom ................. 307/279

OTHER PUBLICATIONS

Electronics International, vol. 56, No. 17, Aug. 1983, pp. 71-72, New York, U.S.; J. Gosch "Cell Array Sports 230-ps Gate de Lay and 2,600 Functions".
Review of the Electrical Communication Laboratories, vol. 26, No. 9-10, Sep.-Oct. 1978, pp. 1339-1354; Y. Itou et al.: "ECL LSI Circuit Design".
IEEE Journal of Solid-State Circuits, vol. SC-19, No. 3, Jun. 1984, pp. 299-305, New York, U.S.; E. Gouauser et al.: "A Bipolar 230 ps Master-Slice Cell Array with 2600 Gates".
IEEE Transactions on Microwave Theory and Techniques, vol. MTT-32, No. 1, Jan. 1984, pp. 5-10, New York, U.S.; Midda et al., "Analysis of High-Speed GaAs Source-Coupled FET Logic Circuits".
IEEE Electron Device Letters, vol. EDL-3, No. 8, Aug. 1982, pp. 197-199, New York, U.S.; S. Katsu et al.: "A GaAs Monolithic Frequency Divider Using Source Coupled FET Logic".

Primary Examiner—John S. Heyman
Assistant Examiner—M. R. Wamback
Attorney, Agent, or Firm—Cesari and McKenna

[57] ABSTRACT

A source follower current steering logic circuit useful in, for example, fabricating digital integrated logic circuits using gallium arsenide and current mode logic switches. The circuit includes an input logic network which includes level shifting networks to generate output signals having assertion levels of different voltage levels and a reference voltage logic network having a similar level shifting network for generating reference voltages relative to the voltage levels of the assertion levels of the output signals from the input logic network. A logic tree includes current mode logic switches for receiving the output signals from the input logic network and the reference voltage generating network to perform selected logic operations the output signals. The output signals are taken from the logic tree. A top load clamps the output signals to selected voltage levels.

13 Claims, 3 Drawing Figures

OR-AND $Q = (A_1 + A_2 + \cdots A_n) \cdot (B_1 + B_2 + \cdots B_m)$

OR-EX-OR $Q = (A_1 + A_2 \cdots A_n) + (B_1 + B_2 + \cdots B_m)$

D LATCH

SOURCE FOLLOWER CURRENT MODE LOGIC CELLS

BACKGROUND OF THE INVENTION

1. Field of the Invention

The invention relates generally to the field of high-speed digital logic circuits, and more specifically to current mode logic circuits which incorporate field effect transistors as opposed to junction transistors. The invention also provides building blocks for constructing high-speed current mode logic circuits.

2. Description of the Prior Art

Emitter coupled logic circuits, which form part of the general class of circuits known as current mode logic circuits, were first developed a number of years ago to provide extremely fast switching times in digital applications. In an emitter coupled logic circuit, a pair of high-gain transistors are used in which the emitters are connected together to form a node to which a constant current source is also connected. The current source limits the total amount of current which is permitted to flow through both transistors at any one time. The base of one of the transistors, termed here a "reference transistor", is connected to a reference voltage and the base of the other transistor, termed here an "input transistor", is connected to receive the input signal. The output signals are taken from the collector terminals of the transistors, which are connected through loads to a power supply. When the potential, or voltage, level of the input signal is significantly below that of the reference, the reference transistor is energized, or on, to conduct current. Since there is no current through the input transistor, the output signal from its collector terminal is at the voltage level of the power supply. Since current is flowing through the load connected to the reference transistor, the voltage level of the signal taken from its collector terminal is reduced from the power supply level by an amount corresponding to the voltage drop across the load. As the voltage level of the input signal increases to a point near that of the reference voltage, the input transistor also begins to turn on. As the level of the input signal rises, the input transistor conducts more current, increasing the potential level of the node controlled by the current source. Since the potential level of the node is increasing, the potential difference between the base and the emitter of the reference transistor decreases and the reference transistor begins to turn off. Eventually, the level of the input signal increases to a point at which the current through the input transistor causes the potential level of the node to, in turn, rise to a point at which the reference transistor completely turns off. In this condition, the output signal from the collector terminal of the input transistor is low, and from the output transistor of the reference transistor is high, and so the emitter-coupled logic circuit is said to have changed state.

When the input signal again falls, the reverse operation occurs, and the circuit is said to have returned to its original state. The emitter coupled logic circuit is essentially a two-state switch, with the states of the switch being reflected when the two transistors are alternately on and off.

The transistors that comprise the emitter-coupled logic circuit are generally relatively high gain, so that small changes in the voltage level of the input signal are sufficient to turn the reference transistor on and off. Accordingly, small variations in the level of the input signal around the transition level are generally sufficient to cause variations in the states of the transistors that comprise the circuit; that is, the emitter coupled logic circuits usually have relatively poor input "noise" margins. Furthermore, emitter coupled logic circuits take up more space on an integrated circuit chip, since they require the reference transistor in addition to the input transistor. Emitter coupled logic circuits also require buffer circuits such as emitter followers in their output circuits since the logic voltage levels of the output signals from the transistor pair are often shifted from the logic voltage levels of the input signals. In addition, the buffer circuits usually provide relatively small voltage differences between high (asserted) and low (negated) logic levels. Emitter-coupled logic circuits do, however, provide complementary output signals, which often can be beneficial. Furthermore, the transistors forming the circuit are kept in their unsaturated operating region, and so their switching speeds are significantly faster than have been achieved with other logic families.

The emitter coupled logic circuits naturally require junction (that is, NPN or PNP) transistors. In recent years, however, it has become desirable to use field effect transistors (FETs) in constructing digital logic circuits, particularly on integrated circuit chips. Gallium arsenide FETs have become particularly popular in high-speed switching logic, as they provide extremely fast switching times. In many circuits which incorporate field effect transistors, the bipolar transistors have often been substituted directly with field effect transistors to form the FET circuits. The FET substitution in current mode logic circuits has often led to undesirable results, however, particularly relating to the low input noise margins and low differences between voltages of the output logic levels, particularly if gallium arsenide MESFETs are used.

As has been noted, another problem with current mode logic circuits of either FETs or junction transistors is that the output voltage levels are typically shifted from the voltage levels of the input signals. While this can be taken care of by providing emitter or source followers as output buffer transistors, these often require a significant amount of space on the chip.

SUMMARY OF THE INVENTION

The invention aims to provide a new and improved circuit configuration for a digital current mode logic circuit incorporating field effect transistors, particularly MESFETs or metal-semiconductor field effect transistors, in gallium arsenide. Another aspect of the invention is to provide building blocks for providing digital current mode logic circuits incorporating field effect transistors, particularly in integrated circuits using gallium arsenide which have high input noise margins and which provide large voltage swings between logic levels in the output.

In brief summary, the new circuit includes an input logic network which receives the input signals and generates a like number of signals in response thereto which have different voltage levels for the asserted states of the different signals. A reference voltage generating network generates reference voltages at selected voltage levels, the number and values of the reference voltages corresponding to the number of signals from the input logic network and their voltage levels when in the asserted and negated states. The reference voltages are selected so as to be able to drive current mode logic switches in a logic tree portion of the circuit. The input logic network and reference voltage generating network include level shifting circuits, such as diodes, to shift the voltage levels of the respective signals so that the voltage levels of the signals, when asserted, are different. A logic tree receives the signals from the input logic network and the reference voltages from the reference voltage generating network and generates logic signals in response thereto. The logic tree includes a current mode logic switch arrangement associated with each output signal from the input logic network, with the switch arrangements being interconnected to generate output signals that represent a selected logical operation on the signals from the input logic network. A topload clamps the voltage levels of the output signals from the logic tree at selected values and provides a selected margin between the voltage levels of the states of the output signals.

In a specific embodiment, the input logic network receives a plurality of input signals divided into groups and includes circuitry for performing certain logic operations, such as AND or OR operations, on the respective groups of input signals to generate the signals that are coupled to the logic tree.

The building blocks provided by the invention include the input logic network, the reference voltage generating network, the logic tree and the topload. The circuits comprising topload and the reference voltage generating network are the same for each circuit regardless of the logic operation performed. The circuits comprising the input logic network and logic tree vary according to the the logic operation to be performed, but all circuits providing the same logic operations can have the same circuits for the input logic network and logic tree. All logic arrangements can be accommodated with specified circuits for the input logic network and logic tree.

BRIEF DESCRIPTION OF THE DRAWINGS

The invention is pointed out with particularity in the appended claims. The above and further advantages of the invention will be apparent on reference to the following Detailed Description of a Preferred Embodiment when taken in connection with the accompanying drawings in which the three Figures are schematic diagrams illustrating circuits that provide a plurality of diverse logic functions constructed in accordance with the invention, with the circuit of FIG. 1 providing an OR-AND operation, the circuit of FIG. 2 providing an OR-exclusive OR operation, and the circuit of FIG. 3 providing a latch operation, in response to the input signals.

DETAILED DESCRIPTION OF THE ILLUSTRATIVE EMBODIMENTS

Figure 1:
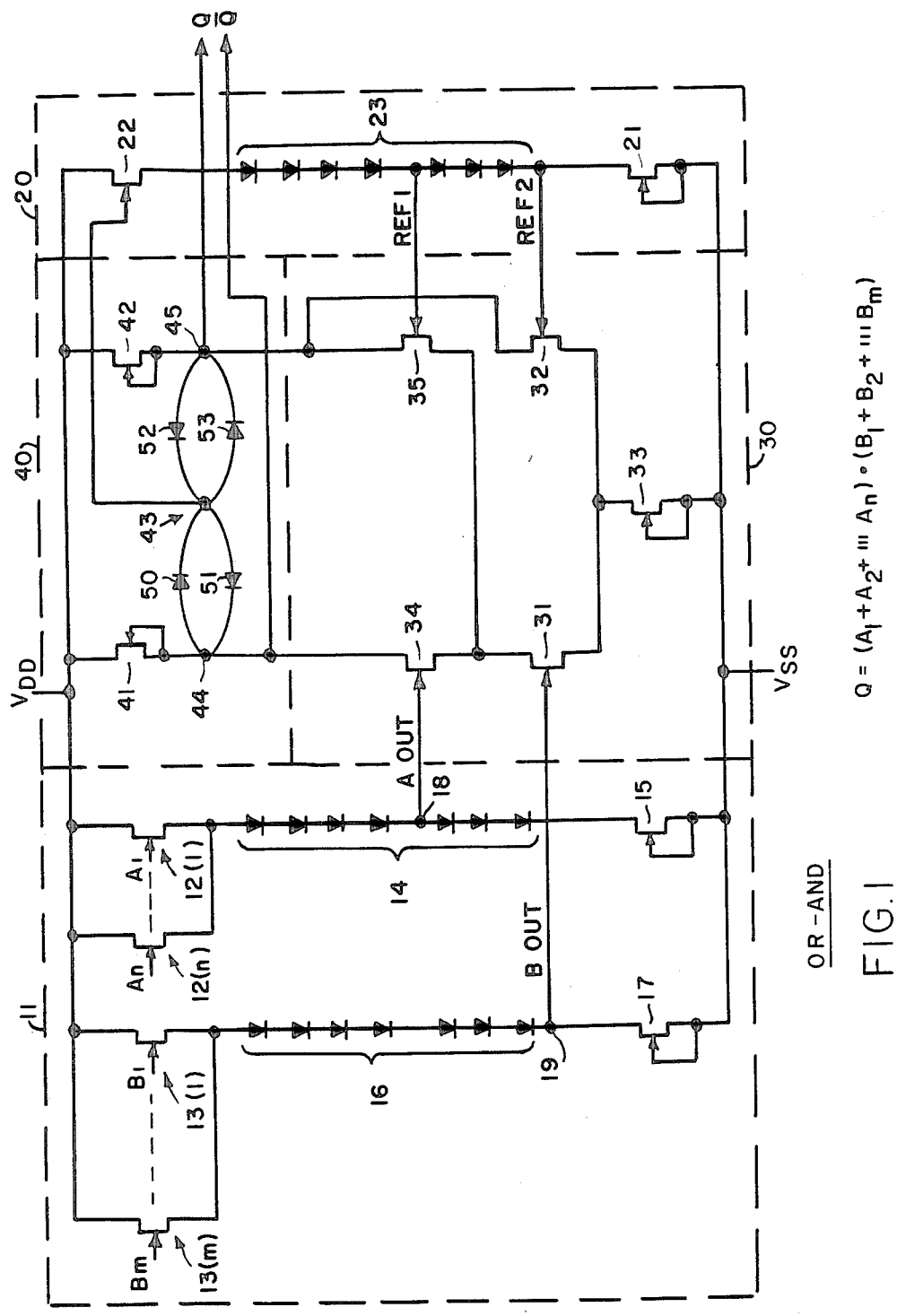

With reference to the figures, FIG. 1 depicts a circuit constructed in accordance with the invention which performs an OR operation on groups of input signals denominated A1 through An and B1 through Bm and an AND operation on the signals resulting from the OR operation. The input signals are received by an input logic network 11 which includes a set of field effect transistors 12(1) through 12(n) which receive the A1 through An signals respectively and a second set of field effect transistors 13(1) through 13(m) which receive the B1 through Bm signals respectively.

The transistors 12(1) through 12(n) are connected in parallel between a drain power supply (not shown) which supplies a voltage Vdd and the anode terminal of the first of a series of level shifting diodes generally indicated by reference numeral 14. The cathode terminal of the last of the series 14 of level shifting diodes is connected to a field effect transistor 15 whose source terminal and gate terminal are connected to a source power supply (not shown) supplying a voltage Vss. The transistor 15 operates as a current source such that if any of the input signals A1 through An are asserted (a high voltage level), turning on the associated ones of transistors 12(1) through 12(n), the current through each of the level shifting diodes comprising series 14 is limited to a selected level. An A OUT output signal is taken from a node 18 between the fourth and fifth level shifting diodes in series 14. Thus, when any of the A1 through An input signals are asserted, the A OUT signal is asserted to a selected voltage level which depends on the level shift caused by the diodes in series 14.

Similarly, transistors 13(1) through 13(m) are connected in parallel between the drain power supply and the anode terminal of the first of a series of level shifting diodes generally indicated by reference numeral 16. The number of diodes in series 16 is the same as in series 14. The cathode terminal of the last of the series 16, which corresponds to a node 19, is connected to a field effect transistor 17 whose source and gate terminals are connected to the source power supply and which serves as a current source. Thus, if any of the B1 through Bm input signals are asserted, the B OUT signal, taken from node 19 is asserted, with the voltage level depending on the level shift caused by the diodes in series 16. The A OUT and B OUT signals have different voltage levels when asserted since they are taken from different nodes in the respective series 14 and 16.

The circuit 10 also includes a reference signal generating section 20 including a transistor 21 whose gate and source terminals are connected to the source power supply and which operates as a current source. A second field effect transistor 22 whose drain terminal is connected to the drain power supply and whose gate terminal is connected to a reference voltage power supply (not shown) which provides a preselected voltage level Vo to control the voltage drop across transistor 22. The voltage drop across transistor 22 serves to control the voltage applied to another series of level shifting diodes generally indicated by the reference numeral 23. The number of level-shifting diodes in series 23 is the same as the number in series 14 and 16 and the diodes also provide similar level shifts. The reference voltage generating section 20 generates reference signals REF1 and REF2 which have voltage levels determined by the voltage drop across transistor 22 and the nodes in series 23 from which the signals are taken. Preferably, the REF1 and REF2 reference signals are obtained from the nodes of series 23 corresponding to the nodes of series 14 and 16 from which the A OUT and B OUT signals are taken. Specifically, the REF1 signal is obtained from the node between the cathode terminal of the fourth level shifting diode and the anode terminal of the fifth level shifting diode in series 23, which corresponds to the node from which the A OUT signal is taken in series 14. Similarly, the REF2 signal is obtained from the node connected to the cathode of the seventh level shifting diode in series 23, which corresponds to the node from which the B OUT signal is taken in series 16.

Circuit 10 also includes a logic tree 30 comprising a plurality of field effect transistors connected to form current mode logic switches which are, in turn, interconnected to perform a selected logic operation on the A OUT and B OUT signals. The interconnection arrangement of the current mode logic switches depends upon the particular logic operation to be performed by the logic tree 30. With specific reference to the circuit depicted in FIG. 1, the logic tree 30 performs an AND operation on the A OUT and B OUT signals from input network 11.

The logic tree depicted in FIG. 1 includes transistors 31 and 32 whose source terminals are connected to form a current mode logic switch. Source terminals are also connected to the drain terminal of a transistor 33, whose gate and source terminals of transistor 33 are connected to the source power supply. Transistor 33 operates as the current source for the current mode logic switch comprising transistors 31 and 32. Logic tree 30 also includes transistors 34 and 35 whose source terminals are also connected together and also connected to the drain terminal of transistor 31. Transistors 34 and 35 are connected to form a second current mode logic switch with transistor 31 operating as the current source.

A topload circuit 40 is connected between the drain power supply and the drain terminals of transistors 34 and 35 in logic tree 30. The topload circuit includes load transistors 41 and 42 which are maintained in saturation and a clamping network 43 which clamps the voltage levels at nodes 44 and 45, from which the Q and Q-bar output signals are taken. The clamping network 43 includes two pairs of switching diodes 50–53 connected in anti-parallel fashion between one of nodes 44 or 45 and the Vo reference voltage.

The voltage levels of the Q and Q-Bar output signals correspond to the Vo voltage plus or minus the voltage drop across one switching diode. For example, if the Q signal is to be asserted and the Q-bar signal negated, the voltage level of node 45 is the Vo voltage level plus the voltage drop across diode 52; if the voltage at node 45 starts to rise above that level, the diode switches on and the voltage drops to that level. Since the load transistor 42 is in saturation, it will supply sufficient current to maintain the voltage level at node 45 at least at the required level. Similarly, the voltage level of the Q-bar signal is the Vo voltage level less the voltage at which the diode 51 turns on; if the voltage at node falls below that level, diode 51 switches on and the voltage increases to that level. When the Q-bar signal is negated, a current path exists from node 44 through logic tree 30 which insures that the voltage level at node 44 does not rise above this level.

On the other hand, if the Q signal is to be negated and the Q-bar signal asserted, diode 50 prevents the voltage level at node 44 from going above a level corresponding to the Vo voltage level plus the voltage difference across diode 50 at which the diode switches on. Similarly, diode 53 prevents the voltage level of node 45 from going below voltage Vo minus the voltage at which diode 53 turns on.

It will be appreciated, therefore, that topload 40 provides a margin of logic levels as between the asserted and negated signals of twice the turn-on voltage of the switching diodes, assuming the turn-on voltages of the switching diodes 50 through 53 are the same.

Returning to the logic tree 30, the logic operation performed by the logic tree depends on the interconnection of transistors in the logic tree. In the specific circuit depicted in FIG. 1, an AND operation is performed, as described below. Other operations can be performed by different interconnections of transistors, examples of which will also be described in connection with FIGS. 2 and 3.

With reference to FIG. 1, and specifically to logic tree 30, transistors 34 and 31 are respectively controlled by the A OUT and B OUT signals from input logic network 11, and transistors 35 and 32 are controlled by the REF1 and REF2 reference voltages provided by reference voltage network 11. When the A OUT and B OUT signals are both negated (at a low voltage level) the transistors 34 and 31 are both off. Since transistor 34 is off, current is blocked from flowing from node 44 through transistor 34. Since transistor 31 is also off, current is also blocked from flowing through transistor 31. However, since transistor 31 is off, transistor 32 is on and so a current path exists from node 45 through logic tree 30, specifically through transistor 32 and current source transistor 31. This enables the voltage level of node 45 to be at a low level, and so the Q output signal is low. Further, since current is blocked from flowing from node 44 through logic tree 30, node 44 is at a high voltage level and so the Q-bar signal is high (asserted).

If the A OUT signal is asserted (at a high voltage level) and the B OUT signal is negated, transistor 31 is off and transistor 32 is on. The A OUT signal enables transistor 34 to be on, but, since transistor 31 is off, current is blocked from flowing from either node 44 or 45 through transistor 34 or transistor 35. The current path through logic tree 30 by way of transistor 32, however, enables the voltage level at node 45 to be low. Since the current path through logic tree 30 by way of transistor 34 is blocked, the voltage level of node 44 is high. Accordingly, the Q signal is low and the Q-bar signal is high.

If the A OUT signal is negated and the B OUT signal is asserted, transistor 34 is off and transistor 31 is on. Since transistor 31 is on, transistor 32 is off, and so the current path therethrough from node 45 is blocked. However, since transistor 34 is off, transistor 35 is on, and so a current path exists from node 45 through transistors 35 and 31. Transistor 34 being off prevents a current path from being established from node 44 through the logic tree 30. Accordingly, the voltage level on node 45 is at a low level and the voltage level on node 44 is at a high level, and so the Q signal is negated and the Q-bar signal is asserted.

Finally, if both the A OUT and B OUT signals are asserted, both transistors 31 and 34 are on and transistors 32 and 35 are off. Accordingly, no current path exists from node 45 through transistors 32 and 35, but a current path is established from node 44 through transistors 31 and 34. Thus, the Q signal is asserted and the Q-bar signal is negated It will be appreciated by those skilled in the art that the selection of the Vo voltage level as applied to transistor 22 can be used to determine the voltage of the A OUT and B OUT signals at which the respective current mode logic switches switch over. This voltage is illustrated in FIG. 1 as being the same voltage as is applied to clamping network 43; however, different voltages may be applied to transistor 22 and clamping network 43 as may be desired.

The circuit depicted in FIG. 1 provides a number of advantages. In particular, the clamping network 43 in topload 40 provides a relatively wide voltage margin between logic levels, specifically twice the turn-on voltage for the switching diodes. If gallium arsenide Schottkey diodes are used, a voltage difference of approximately 1.7 volts may be maintained, which is essentially independent of the current flowing through the circuit. The capacitance of the diodes are typically relatively small and generally do not add any significant loading to the capacitance as presented to logic tree 30. If MESFETs are used as load transistors 41 and 42, rather than resistors as in the prior art, comfortable margins between the logic voltage levels may be maintained.

When using gallium arsenide, the transistors are usually depletion mode transistors which require the use of level shifting diodes such as the diodes in series 14 and 16 in input logic network 11. In the inventive circuit, the level shifting diode series are also used, with respective input transistors 12(1) through 12(n) and 13(1) through 13(m) to do OR logic operations on input signals A(1) through A(n) and B(1) through B(m). In typical prior circuits, such OR operations were performed in circuitry in the logic tree 30 by connecting plural transistors in parallel with transistors 31 and 34. The prior arrangement, however, complicated loading in the output signals, which resulted in increased problems in maintaining satisfactory logic voltage levels.

Further, since the reference voltage level-shifting series 23 is identical to the series 14 and 16, the size of transistor 22 can be adjusted to accommodate the fan-in of input signals A(1) through A(n) and B(1) through B(m). In many cases in the prior art, it has been difficult to match the fan end of the input signals and the references, which may result from non-uniformity in wafer processing. In the invention, such problems are significantly reduced.

The adaptation of the various elements, specifically logic input network 11, reference voltage generating network 20, logic tree 30 and topload 40, to provide diverse logic operations on the input signals will be illustrated in connection with FIGS. 2 and 3. In those Figures, the respective input logic networks 111 (FIG. 2) and 211 (FIG. 3) are the same as the input logic network 11 (FIG. 1), except that in FIG. 3, instead of having multiple input signals in each of the groups A1 through An and B1 through Bm and corresponding input transistors 12(1) through 12(n) and 13(1) through 13(m), only one input signal D and CLK and input transistor 212 and 213 is present for each group. Otherwise, the circuits comprising the input logic networks, reference voltage generating networks 120 and 220 and toploads 140 and 240 are the same as the circuits comprising input logic network 11, reference voltage generating network 20 and topload 40, respectively, depicted in FIG. 1, and they operate in an identical manner. However, the logic trees 130 (FIG. 2) and 230 (FIG. 3) operate differently from the logic tree 30 (FIG. 1) to provide diverse logic operations.

As has been noted, the logic tree 30 (FIG. 1) provides an AND logic operation on the A OUT and B OUT signals from input logic network 11. The logic tree 130 (FIG. 2) provides a Q output signal which has a logical state corresponding to the exclusive-OR operation on the A OUT and B OUT signals, and the logic tree 230 (FIG. 3) provides a latch operation in which the Q output signal has the same logical state as the D input signal when the CLK input signal is in the negated state, and, while the CLK input signal is in the asserted state, the state of the Q output signal corresponds to the logical state of the D input signal at the time the CLK input signal switched from the negated to the asserted state.

Figure 2:
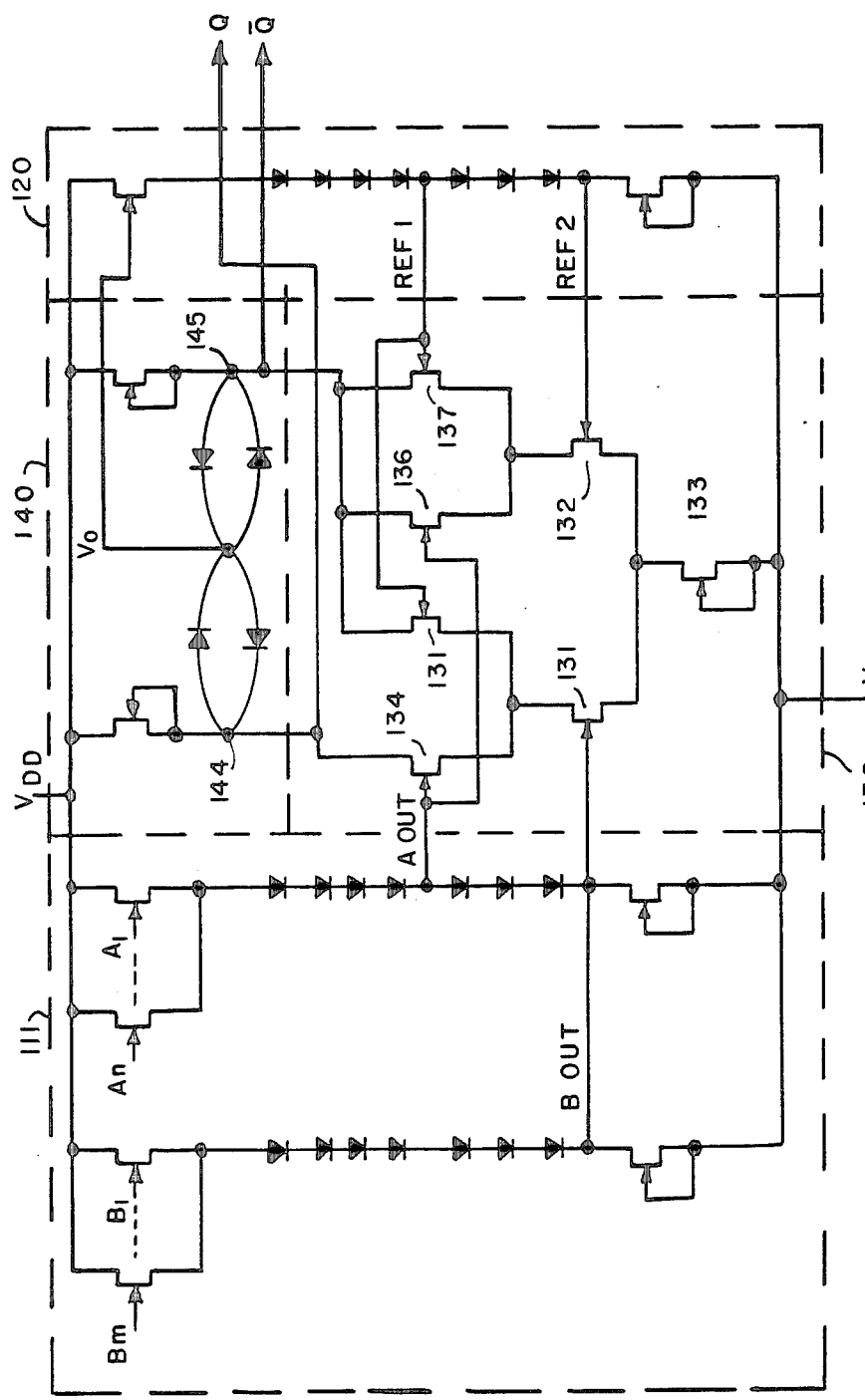

With reference to FIG. 2, the logic tree 130 includes transistors 131 and 132 which, in combination with a current source transistor 133, forms a current mode logic switch with the REF2 signal from reference voltage generating network 120 being the reference voltage for the switch. Each of the transistors 131 and 132, in turn, controls a current mode logic switch, with transistor 131 providing the current source for the switch comprising transistors 134 and 135, and transistor 132 providing the current source for the switch comprising transistors 136 and 137. Transistors 134 and 137 control a node 144 in topload 140, from which the Q output signal is taken. Transistors 135 and 136 control a node 145 in topload 140, from which the Q-bar output signal is taken.

The logic tree 130 (FIG. 2) operates as follows. If the B OUT signal is negated, which occurs when all of the B1 through Bm signals are negated, transistor 131 is off, and so transistor 132, controlled by the REF 2 signal, is on. Thus, the current mode logic switch comprising transistors 134 and 135 is disabled, and the switch comprising transistors 136 and 137 is enabled. If the A OUT signal is also negated, which occurs when all of the A1 through An signals are negated, transistor 136 is off and transistor 137 is on. Thus, a current path exists from node 144 through logic tree 130, and so the Q output signal is pulled low (negated). Since both transistors 135 and 136 are off, no current path exists from node 145 through logic tree 130, and so the Q-bar output signal remains at a high level, that is, it is asserted.

If the B OUT signal is negated and the A OUT signal is asserted, which occurs when at least one of the A1 through An signals is asserted, transistors 131 and 132 are in the conditions as noted in the preceeding paragraph. However, since the A OUT signal is asserted, the transistor 136 is on and transistor 137 is off. Thus, a current path exists from node 145 through logic tree 130, and so the Q-bar output signal is pulled low (negated). Since transistors 137 and 134 are both off, no current path exists from node 144 through logic tree 130, and so the Q output signal is maintained at a high (asserted) level.

If the B OUT signal is asserted, which occurs when at least one of the B1 through Bm signals is asserted, transistor 131 is on and transistor 132 is off. Accordingly, the current mode logic switch comprising transistors 134 and 135 is enabled, and the switch comprising transistors 136 and 137 is enabled. If the A OUT signal is negated, transistor 135 is turned on and transistor 134 is turned off. Thus, a current path exists from node 145 through logic tree 130, and so the Q-bar output signal is negated. Since transistors 134 and 137 are both off, no current path exists from node 144 through logic tree 130, and so the Q output signal is asserted.

Finally, if the B OUT signal is asserted and the A OUT signal is asserted, the transistors 131 and 132 are in the conditions as noted in the preceeding paragraph. However, since the A OUT signal is asserted, transistor 134 is on and transistor 135 is off. Thus, a current path exists from node 144 through logic tree 130, and so the Q output signal is negated. Since transistors 135 and 136 are both off, no current path exists from node 145 through logic tree 130, and so the Q-bar signal is asserted.

As is apparent from the preceeding, the Q signal is asserted when one, but not both, of the A OUT or B OUT signals is asserted, and is otherwise negated, as is required for an exclusive-OR logic circuit.

Figure 3:
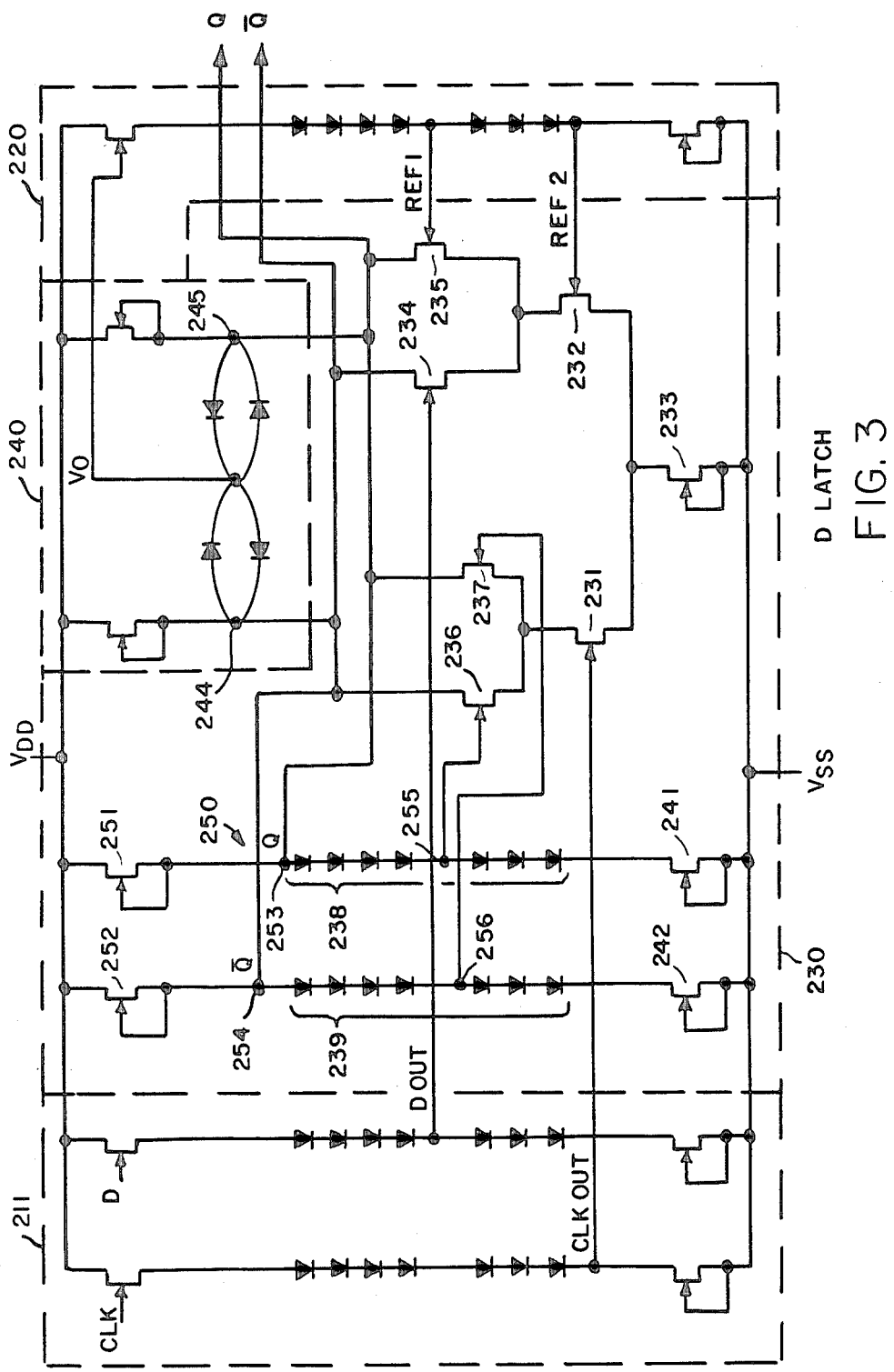

In the circuit depicted in FIG. 3, the logic tree 230 of the latch circuit includes transistors 231 and 232 which, along with a transistor 233, which serves as a current source, form a current mode logic switch. When a CLK OUT signal from input logic network 211 is negated (low), which occurs when a CLK input signal is negated (low), transistor 231 is off and transistor 232, which is controlled by the reference voltage REF2 from reference voltage generating network 220, is on.

The transistor 232 also forms the current source for a current mode logic switch comprising transistors 23 and 235. When the D OUT signal from input logic network 211 is asserted (high) in response to the assertion of the D input signal, transistor 234 is on, forcing transistor 235, which is controlled by the reference voltage REF1 from reference voltage generating network 220, to be off. Thus, a current path exists from node 244 through logic tree 230 by way of transistors 234 and 232, and so the Q-bar signal is pulled low. Since transistors 231 and 235 are off, current paths from node 245 through logic tree 230 are blocked, and so the state of the Q output signal is high (asserted).

If, on the other hand, the D OUT signal is negated, transistor 234 is off and transistor 235 is on. In this condition, since transistor 231 is also off, current paths are blocked from node 244 through logic tree 230 and so the Q-bar output signal is asserted. Since transistors 235 and 232 are both on, a current path exists from node 245 through logic tree 230, and so the Q output signal is negated.

When the CLK OUT signal is asserted, transistor 232 is off, which disables transistors 234 and 235 and blocks any current path therethrough from nodes 244 and 245. The high CLK OUT signal turns transistor 231 on. Transistor 231 forms the current source for a differentially connected pair of transistors 236 and 237 which are controlled by a feedback network 250 which operates in response to the Q and Q-bar output signals. When the state of the CLK OUT signal shifts from low (negated) to high (asserted), enabling transistor 231 and disabling transistor 232, the differential transistor pair 236 and 237, and feedback network 250 serve to thereafter maintain the Q and Q-bar signals in their respective states. In this condition, the conditions of the Q and Q-bar signals are not effected by any changes in the condition of the D input signal.

Specifically, if the Q signal is asserted, a node 253 in feedback network 250 is maintained at a high voltage level. Since the Q-bar signal is negated (low), a voltage drop occurs across a load transistor 252 to pull a node 254 to a low voltage level. Node 253 is connected to the anode of the first of a series 238 of level shifting diodes. The series 38, in turn, is connected to a current source transistor 241, which, in turn, is connected to the source power supply. A signal is taken from a node 255 to control transistor 236, and so when the Q signal is asserted, the transistor 236 is on.

Node 254 is also connected to the anode of the first of a series 239 of level shifting diodes, which is also connected through a current source transistor 242 to the source power supply. When the Q-bar signal is low, a voltage drop occurs across load transistor 252, to pull the node 254 low. Accordingly, node 256 is also low. A signal is taken from node 256 to control transistor 237.

The transistors 236 and 237 are enabled by the signals from nodes 255 and 256, which are controlled by the Q and Q-bar signals. Until the CLK OUT signal goes high, however, turning on transistor 231, both transistors 236 and 237 are off. Transistor 236, when enabled by the signal from node 255 and turned on when transistor 231 is turned on by the CLK OUT signal, provides a current path from node 244 through logic tree 230, specifically through transistors 236 and 231. Accordingly, the Q-bar signal remains negated (low). Transistors 237 and 232, being off, block any current path through logic tree 230 from node 245, and so the Q signal is in the high (asserted) condition. Thus, node 254 remains low and node 253 remains high, maintaining transistors 236 and 237 in their respective conditions.

If the Q-bar signal is asserted (high) and the Q signal is negated (low), the voltage level of node 253 is pulled low through a load transistor 251, and the voltage level of node 254 remains high. Accordingly, node 255 is at a low voltage level and node 256 is at a high voltage level, disabling transistor 236 and enabling transistor 237. When the condition of the CLK OUT signal shifts from the low (negated) state to the high (asserted) state turning transistor 231 on and transistor 232 off, transistor 237 is turned on. A current path is established from node 245 through logic tree 230 by way of transistors 237 and 231, holding the Q-bar signal low. Since transistors 236 and 232 are off, current paths through logic tree 230 are blocked. Further, since the voltage level of node 244 is high and the voltage level of node 245 is low, the voltage level of node 254 remains high, and the level of node 253 remains low after the CLK OUT signal shifts to a high condition. These voltage levels maintain transistors 237 on and transistor 236 off and the Q and Q-bar signals in their respective conditions.

When the CLK OUT signal again shifts from the high to the low condition, transistor 231 is turned off thereby disabling both transistors 236 and 237, and transistor 232 is turned on thereby enabling the current mode logic switch comprising transistors 234 and 235. In this condition, the states of the Q and Q-bar output signals are responsive to the D input signal.

Thus, circuits performing numerous logic operations can be designed using the building blocks, specifically the input logic network, logic tree, topload and reference voltage generating network depicted in the figures, merely by providing a logic tree for performing the necessary logic operation. If desired to provide OR operations on groups of input signals, that can be done in the input logic network.

The foregoing description is limited to a specific embodiment of this invention. It will be apparent, however, that this invention can be practiced in systems having diverse basic construction or that use different internal circuitry than is described in the specification with the attainment of some or all of the advantages of this invention. Therefore, it is the object of the appended claims to cover all such variations as come within the true spirit and scope of this invention.

What is claimed as new and desired to be secured by Letters Patent of the United States is:

1. A source follower current steering logic circuit for performing a logic operation on a plurality of input signals comprising:
 A. first and second input branches each including:
  (i) input means for receiving an input signal and for generating a signal in response thereto;
  (ii) signal generating means connected to said input means for receiving the signal therefrom and for generating an output signal having a selected voltage level in response thereto, said signal generating means of both said first and second input branches having a corresponding predetermined number of level shifting means each having an output connected serially between a power supply means and said input means, the output signal from signal generating means of one input branch being taken from the output of a different level shifting means than the output of the signal generating means of the other input branch so that output signals from the first and second input branches have different voltage levels;

B. reference branch means also having a plurality of serially-connected level shifting means, each having an output connected to a power supply means, the number of level shifting means in said reference branch means corresponding to the number of level shifting means in said signal generating means in each of said input branches, the reference branch means generating reference voltage signals from the outputs of level shifting means corresponding to the level shifting means in said signal generating means of each of said first and second input branches from which output signals are taken;

C. logic branch means connected to said signal generating means and said reference branch means for generating logic output signals the states of which are determined by a comparison between the voltage levels of said output signals from said signal generating means and the voltage levels of said reference signals; and D. output branch means connected to said logic branch means for receiving the logic output signals from said logic branch means for generating digital signals having predetermined voltage levels in response to the logic output signals from said logic branch means.

2. A source follower current steering logic circuit for performing a logic operation on a plurality of input signals comprising:

A. first and second input branches each including signal generating means connected for receiving an input signal and for generating an output signal having a selected voltage level in response thereto, said signal generating means of both said first and second input branches having a corresponding predetermined number of level shifting means, each having an output, connected serially with the output signal from the signal generating means of one input branch being taken from the output of a different level shifting means than the output of the signal generating means of the input branch such that output signals from the first and second input branches have different voltage levels;

B. reference branch means also having a plurality of serially-connected level shifting means, each having an output, the number of level shifting means in said reference branch means corresponding to the number of level shifting means in said signal generating means in each of said input branch means, the reference branch means generating reference voltage signals from the outputs of level shifting means corresponding to the level shifting means in each of said first and second input branches from which output signals are taken; and C. logic branch means connected to said signal generating means and said reference branch means for generating logic output signals in response to the output signals from said first and second input branches, the states of said logic output signals being determined by a comparison between the voltage levels of said output signals from said signal generating means and the voltage levels of said reference signals and for generating digital signals having predetermined voltage levels in response to the logic output signals from said logic branch means.

3. A source follower current steering logic circuit for performing a logic operation on a plurality of input signals comprising:

A. first and second input branches each including:
  (i) input logic means each for receiving a plurality of input signals and for generating a signal in response to the received signals having selected conditions;
  (ii) signal generating means connected to said input means and to a current source means for receiving the signal therefrom and for generating an output signal having a selected voltage level in response thereto, said signal generating means of both said first and second input branches having a corresponding predetermined number of level shifting diode means each having an output, connected serially between said current source means and said input means, the output signal from the signal generating means of one branch being taken from the output of a different level shifting means than the level shifting means from which the output signal is taken in the signal generating mean of the other branch have different voltage levels;

B. reference branch means having a plurality of serially-connected level shifting diode means, each having an output, connected to a current source means, said level shifting diode means of said reference branch means corresponding to the number of level shifting diodes means of said signal generating means of each of said input branches, the reference branch means generating reference voltage signals from the outputs of level shifting diode means corresponding to the level shifting diode means in each of said first and second input branches from which output signals are taken so that each reference voltage signals has a voltage level that is proportional to the voltage levels of an output signal of said signal generating means when said output signal is in a selected condition;

C. logic branch means connected to said signal generating means and said reference branch means for generating logic output signals in response to the voltage levels of said output signals from said signal generating means, the states of said logic output signals being determined by a comparison between the voltage levels of said output signals from said signal generating means and the voltage levels of said reference signals, said logic branch means including a plurality of transistor means each having a drain terminal, a source terminal and a gate terminal, each gate terminal being connected to receive one of said reference voltage signals or said output signals from said signal generating means, said source terminals of said transistor means which receive corresponding reference and output signals being connected together so that the transistor means which is controlled by an output signal is on only if the voltage level of the output signal is greater than the voltage level of the corresponding reference signal, the logic output signals being generated in response to the signals at the drain terminals of said transistor means; and D. Output branch means connected to said logic branch means for receiving the logic output signals from said logic branch means for generating digital signals having predetermined voltage levels in response to the logic output signals from said logic branch means, said output branch means including voltage reference input means for receiving an output voltage reference signal and anti-parallel diode means connected between the voltage reference input means and the drain terminals of said transistor means from which the logic output signals are received, the antiparallel diode means clamping the digital signals at voltage levels determined by the voltage level of said output voltage reference signal.

4. A source follower current steering logic circuit for performing a logic operation on a plurality of input signals comprising:

A. input branch means including first and second signal generating means each connected for receiving an input signal and for generating an output signal having a selected voltage level in response thereto, each said signal generating means having a corresponding predetermined number of voltage level shifting means connected serially, each having an output, with the output signal from one branch's signal generating means being taken from the output of a different level shifting means than the output signal of the signal generating means of the other input branch such that the output signals from the first and second signal generating means have different voltage levels.

B. reference branch means having a like number of serially-connected level shifting means, each having an output for generating reference voltage signals from the outputs of level shifting means, the reference voltage signals being taken from level shifting means which correspond to the level shifting means in each of said first and second signal generating means from which output signals are taken;

C. logic means including current mode logic switch means connected to said signal generating means and said reference branch means for performing a selected logic operation and, in response thereto, transmitting complementary logic output signals, said current mode logic switch means being connected to perform the selected logic operation in response to the output signals from said first and second signal generating means, the states of said logic output signals being determined by a comparison between the voltage levels of said output signals from said signal generating means and the voltage levels of said reference signals; and D. clamp means connected to said logic means for clamping said complementary logic output signals to predetermined voltage levels.

5. A source follower current steering logic circuit as defined in claim 4 in which said logic means includes a current mode logic switch means for each of said output signals from said first and second signal generating means, said current mode logic switch means being interconnected to provide the selected logic operation, each current mode logic switch means including a reference transistor and an input transistor, with each said input transistor being connected to and controlled by the output signal from the respective first or second signal generating means and each reference transistor being connected to and controlled by the reference voltage signal from the level shifting means in said reference branch means corresponding to the level shifting means from which the output signal is taken.

6. A source follower current steering logic circuit as defined in claim 4 wherein said logic means includes node means connected to said current mode logic switch means from which said logic output signals are transmitted, said clamp means comprising anti-parallel connected diode means connected between a terminal for receiving a reference voltage and said node means.

7. A source follower current steering logic circuit as defined in claim 4 wherein each said signal generating means includes input transistor means for connection to receive an input signal, and each said level shifting means comprises a level shifting diode, the output of said input transistor means being connected to the first diode in the series comprising said level shifting means, the output signal being taken from a terminal of a selected diode.

8. A source follower current steering logic circuit as defined in claim 7 wherein at least one of said signal generating means includes additional input transistor means in parallel with said first input transistor means output signal if at least said input signals connected to any of said input transistor means is asserted 9. A source follower current steering logic circuit as defined in claim 5 wherein one of said current mode logic switch means is connected serially with one of the transistors in the second current mode switch means to provide a logical AND operation on the output signals from said input branch means.

10. A source follower current steering logic circuit as defined in claim 5 comprising three current mode logic switch means, the three current mode logic switch means being interconnected so that each transistor in one of said current mode logic switch means is connected to enable one of said other current mode logic switch means, one of the input signals being connected to control said input transistor in said one current mode logic switch means and the other input signal being connected to control input transistors in both of said other current mode logic switch means, the output terminals of said other current mode logic switch means being interconnected so that the logic output signals of said circuit provides an exclusive-OR operation on said output signals from said input branch means.

11. A source follower current steering logic circuit as defined in claim 10 wherein the output terminals of each of said other current mode logic switch means are interconnected so that the output terminal of the reference transistor one of said other current mode logic switch means is connected to the output terminal of the input transistor of the other of said other current mode logic switch means, the logic output signals being taken from the connections between output terminals of the transistors of said other current mode logic switch means.

12. A source follower current steering logic circuit as defined in claim 5 in which said logic means includes a energizable current mode logic switch means controlled by an output signal from said input branch means, energizable feedback means connected to the output terminals of said current mode logic switch means for latching the signal at the output terminals, and second current mode logic switch means controlled by another output signal from the input branch means for selectively energizing said first current mode logic switch means or said feedback means in response to the other output signal from said input branch means.

13. A source follower current steering logic circuit as defined in claim 12 wherein said feedback means comprises differentially connected transistor means connected to be enabled in tandem by said other current mode logic switch means, and a plurality of serially connected level shifting means, each of said level shifting means generating a signal in response to said output logic signal for controlling the operation of one of the transistors in said differentially connected transistor means.

* * * * *